(12) United States Patent
Lundberg et al.

(10) Patent No.: US 11,023,702 B2
(45) Date of Patent: *Jun. 1, 2021

(54) FINGERPRINT SENSING MODULE AND METHOD FOR MANUFACTURING THE FINGERPRINT SENSING MODULE

(71) Applicant: Fingerprint Cards AB, Gothenburg (SE)

(72) Inventors: Nils Lundberg, Höllviken (SE); Zhimin Mo, Lund (SE); Mats Slottner, Lerum (SE)

(73) Assignee: Fingerprint Cards AB, Gothenburg (SE)

( * ) Notice: Subject to any disclaimer, the term of this patent is extended or adjusted under 35 U.S.C. 154(b) by 34 days.

This patent is subject to a terminal disclaimer.

(21) Appl. No.: 16/512,845

(22) Filed: Jul. 16, 2019

(65) Prior Publication Data

US 2019/0340406 A1 Nov. 7, 2019

Related U.S. Application Data

(63) Continuation-in-part of application No. 15/807,679, filed on Nov. 9, 2017, now Pat. No. 10,395,164.

(30) Foreign Application Priority Data

Dec. 15, 2016 (SE) .................................. 1651654-4

(51) Int. Cl.
    *G06K 9/00* (2006.01)
    *G06K 19/073* (2006.01)

(52) U.S. Cl.
    CPC ..... *G06K 9/0002* (2013.01); *G06K 19/07354* (2013.01)

(58) Field of Classification Search
    CPC ............... G06K 19/145; G06K 9/0002; G06K 9/00053; G06K 19/07701; G06K 19/0772; G06K 19/18
    See application file for complete search history.

(56) References Cited

U.S. PATENT DOCUMENTS 9,576,177 B2 * 2/2017 Lundahl ................. G06K 9/209
9,792,516 B2 * 10/2017 Vogel ................. G06K 9/00087
(Continued)

FOREIGN PATENT DOCUMENTS

CN      101226586 A     7/2008
CN      102782700 A    11/2012
(Continued)

OTHER PUBLICATIONS

Swedish Search Report dated Jul. 20, 2017 for Swedish Application No. 1651654-4, 3 pages.
(Continued)

*Primary Examiner* — Utpal D Shah
(74) *Attorney, Agent, or Firm* — RMCK Law Group, PLC

(57) ABSTRACT

There is provided a fingerprint sensing module comprising a fingerprint sensor device having a sensing array arranged on a first side of the device, the sensing array comprising an array of fingerprint sensing elements. The fingerprint sensor device also comprises connection pads for connecting the fingerprint sensor device to external circuitry. The fingerprint sensing module further comprises a fingerprint sensor device cover structure arranged to cover the fingerprint sensor device, the cover structure having a first side configured to be touched by a finger, thereby forming a sensing surface of the sensing module, and a second side facing the sensing array, wherein the cover structure comprises conductive traces for electrically connecting the fingerprint sensor module to external circuitry, and wherein a surface
(Continued)

area of the cover structure is larger than a surface area of the sensor device. Moreover, the fingerprint sensor device comprises wire-bonds electrically connecting the connection pads of the fingerprint sensing device to the conductive traces of the cover structure.

7 Claims, 9 Drawing Sheets

(56) References Cited

U.S. PATENT DOCUMENTS

| | | | | |
|---|---|---|---|---|
| 10,061,965 | B2* | 8/2018 | Lin | H01L 24/73 |
| 2011/0254108 | A1* | 10/2011 | Gozzini | G06K 9/00053 |
| | | | | 257/415 |
| 2011/0309482 | A1* | 12/2011 | Salatino | H01L 23/3135 |
| | | | | 257/659 |
| 2012/0049309 | A1 | 3/2012 | Kiyomoto et al. | |
| 2015/0030217 | A1* | 1/2015 | Wickboldt | G06K 19/07756 |
| | | | | 382/124 |
| 2015/0229108 | A1* | 8/2015 | Steigerwald | H01S 5/04253 |
| | | | | 372/45.01 |
| 2016/0210495 | A1* | 7/2016 | Jagemalm | G06K 9/0002 |
| 2016/0335470 | A1 | 11/2016 | Park et al. | |
| 2016/0358008 | A1 | 12/2016 | Lundahl | |

FOREIGN PATENT DOCUMENTS

| | | |
|---|---|---|
| CN | 204808272 U | 11/2015 |
| CN | 106158760 A | 11/2016 |
| CN | 207601824 U | 7/2018 |
| DE | 19921231 A1 | 11/2000 |
| DE | 10221214 A1 | 11/2003 |
| DE | 102013113901 B3 | 1/2015 |
| WO | 0108092 A1 | 2/2001 |
| WO | 0225825 A2 | 3/2002 |
| WO | 03049012 A2 | 6/2003 |
| WO | 2004025545 A2 | 3/2004 |
| WO | 2011080262 A1 | 7/2011 |
| WO | 2013160011 A1 | 10/2013 |
| WO | 2015013530 A1 | 1/2015 |

OTHER PUBLICATIONS

U.S. Appl. No. 15/807,679, filed Nov. 9, 2017, Lundberg et al.
Extended European Search Report dated May 9, 2018 for EP Application No. 17207037.7, 3 pages.

* cited by examiner

FINGERPRINT SENSING MODULE AND METHOD FOR MANUFACTURING THE FINGERPRINT SENSING MODULE

CROSS REFERENCE TO RELATED APPLICATIONS

This application is a continuation-in-part of U.S. application Ser. No. 15/807,679, filed on Nov. 9, 2017, which claims priority to Swedish Application No. 1651654-4, filed on Dec. 15, 2016. The disclosures of each of the above applications are incorporated herein by reference in their entirety.

FIELD OF THE INVENTION

The present invention relates to a fingerprint sensing module suitable for integration in smart cards, and to a method for manufacturing such a fingerprint sensing module. The present invention also relates to a smart card comprising such a fingerprint sensing module.

BACKGROUND OF THE INVENTION

Various types of biometric systems are used more and more in order to provide increased security and/or enhanced user convenience. In particular, fingerprint sensing systems have been adopted in, for example, consumer electronic devices, thanks to their small form factor, high performance, and user acceptance.

Among the various available fingerprint sensing principles (such as capacitive, optical, thermal etc.), capacitive sensing is most commonly used, in particular in applications where size and power consumption are important issues. All capacitive fingerprint sensors provide a measure indicative of the capacitance between each of several sensing structures and a finger placed on or moved across the surface of the fingerprint sensor.

Moreover, fingerprint sensor integration in smart cards is increasingly requested by the market. However, the requirements of the fingerprint sensor in a smart card may change compared to when the sensor is used in a smartphone. For example, since the cost of a smartcard is significantly lower than the cost of smartphone, it is even more desirable to reduce the cost of the fingerprint sensor for a smart card.

In presently available smart cards, fingerprint sensor modules can be soldered on an inlay and the card is in turn laminated with the inlay as a center layer and with a cavity in the card upper layer leaving the fingerprint sensor module exposed upon card lamination.

However, a gap between the fingerprint sensor module and the card body is often visible, creating reliability and cosmetic problems. Moreover, the described process is typically only used for limited series and not suitable for mass production.

Accordingly there is a need for an improved method for providing a smartcard comprising a fingerprint sensor module, and for a fingerprint sensor module for integration in a smart card.

SUMMARY

In view of above-mentioned and other drawbacks of the prior art, it is an object of the present invention to provide an improved fingerprint sensor module suitable for integration with a smart card, and a method for manufacturing such a module.

According to a first aspect of the invention, there is provided a fingerprint sensing module comprising a fingerprint sensor device having a sensing array arranged on a first side of the device, the sensing array comprising an array of fingerprint sensing elements. The fingerprint sensor device also comprises connection pads for connecting the fingerprint sensor device to external circuitry. The fingerprint sensing module further comprises a fingerprint sensor device cover structure arranged to cover the fingerprint sensor device, the cover structure having a first side configured to be touched by a finger, thereby forming a sensing surface of the sensing module, and a second side facing the sensing array, wherein the cover structure comprises conductive traces for electrically connecting the fingerprint sensor module to external circuitry, and wherein a surface area of the cover structure is larger than a surface area of the sensor device. Moreover, the fingerprint sensor device comprises wire-bonds electrically connecting the connection pads of the fingerprint sensing device to the conductive traces of the cover structure.

In the present context, the fingerprint sensor device may also be referred to as a die, a chip, a capsule or the like, and the fingerprint sensor may be a capacitive, optical or ultrasonic fingerprint sensor.

In the described fingerprint module, the sensing array faces the cover structure such that the surface of the cover structure forms the sensing surface of the cover structure. The described cover structure comprises at least an insulating layer and a layer comprising the conductive traces. However, the cover structure may equally well comprise a plurality of sub-layers.

The present invention is based on the realization that when attaching a fingerprint sensing device to a cover layer comprising conductive traces, it is advantageous to form the connection between the sensor and the cover layer using wire bonding. Hereby, a fingerprint sensing module is provided which is easily integrated in a smart card by means of the conductive traces of the cover structures, as will be described in further detail in the following. However, the described module may also be suitable for integrating in a wide range of applications, since a module can be provided where e.g. the size and shape off the module can be easily controlled by means of the cover structure.

According to one embodiment of the invention, the connection pads may be arranged on a second side of the fingerprint sensor device, opposite of said first side, the fingerprint sensor device further comprising a substrate comprising via connections reaching from the first side of the fingerprint senor device to the connection pads of the second side of the fingerprint sensor device. Hereby, a fingerprint sensor device is provided where the wire bonding between the sensor device and the cover structure is performed from the backside of the sensor device, opposite of the sensing array. In particular, there is no need for bond wires on the side of the fingerprint sensor comprising the sensing array. Accordingly, the described arrangement is advantageous in that the distance between the sensing array and the outer surface of the cover structure can be reduced, thus reducing the distance from the sensing array and a finger placed on the sensing surface, which improved the performance of the sensing device.

The fingerprint sensor device may also comprise wafer level fan-out technology for providing the connection pads used as bond pads.

According to one embodiment of the invention, the connection pads are arranged on the first side of the fingerprint sensor device, the fingerprint sensor device further comprising a carrier having a first side attached to the second side of the fingerprint sensor device, wire bonds arranged between the connection pads of the fingerprint sensor device and the first side of the carrier; and wire-bonds arranged between a second side of the carrier, opposite of the first side, and the conductive traces of the cover structure. Accordingly, there is an intermediate connection between the connection pads of the fingerprint sensor device and the connection pads of the carrier. The connection pads of the carrier serve as bond pads for connecting to the conductive traces of the cover structure. For some applications, it is acceptable with a sensor device comprising bond wires on the same side as the sensing array, even though the bond wires may increase the minimum distance between the sensing array and a finger placed ion the sensing surface. The distance between the sensing array and the cover structure will then be determined by the bond-wire loop height and the thickness of an overmold layer covering the sensing array and the bond wires. Such an arrangement may for example be used, for example for a relatively thin cover structure. Thereby, conventional fingerprint modules can be easily adapted in order to be used in smart card applications.

Moreover, the fingerprint sensor device may be provided as an LGA (Land Grid Array) a lead frame based QFN-package, or by means of other packaging types known by the skilled person.

According to one embodiment of the invention the fingerprint sensor may further comprise a mold layer arranged between the sensing device and the cover structure. The described mold layer would serve to protect the sensing array and to provide a planar surface for attaching the sensing device to the cover structure.

According to one embodiment of the invention, the cover structure may be a laminate structure comprising at least one layer compromising conductive traces and at least one insulating layer. The cover structure may comprise one or more coating layers, comprising ink layers, to provide a desirable visual appearance. An ink layer should herein be understood as any layer comprising a pigment for achieving a desired visual appearance. The cover structure may also comprise a layer for enhancing image capture, for example if the finger contains moisture.

According to one embodiment of the invention the fingerprint sensing module may further comprise one or more passive components, arranged on the second side of the cover structure and electrically connected to the conductive traces of the cover structure.

Moreover, the passive component may also be arranged on the first side of the carrier and electrically connected to conductive traces of the cover structure. Thereby, a fingerprint sensing module can be provided as a single module including any required passive components.

According to one embodiment of the invention the fingerprint sensing module may further comprise a fingerprint sensor control device attached to a second side of the fingerprint sensing module, the second side being opposite of the first side. A fingerprint sensor control device may for example be required for providing a drive signal of the sensing device, or the control device may comprise other functionality. The control device may be provided as a die, chip, capsule or the like, and is sometimes referred to as a companion chip. By providing the fingerprint sensor control device in a stacked configuration, which may also be referred to as a possum configuration, a complete fingerprint sensing module comprising all the required functionality can be provided. The fingerprint sensing module is thereby ready to be incorporated in a range of applications, such as a smart card. Moreover, the stacked configuration reduces the footprint area of the fingerprint sensor module in comparison to known configurations where the sensor device is connected to a control device located at a distance from the sensor device e.g. using a flexible film.

According to one embodiment of the invention, the fingerprint sensing module may further comprise wire-bonds electrically connecting the fingerprint sensor control device to conductive traces of the cover structure. Thereby, both the fingerprint sensor device and the control device can be connected to the same cover structure using the same connection technology. Moreover, a fingerprint sensor module is provided where all of the required connections for operating the module are located on the second side of the cover structure for easy access.

According to one embodiment of the invention the fingerprint sensing module may further comprise a silicon interposer layer arranged between the fingerprint sensor control device and the second side of said fingerprint sensing module. The interposer layer can be electrically connected by wire bonding to the cover structure and it may for example be used to form electrical connections between the control device and the sensor device. For example, the interposer layer may be used for routing signals between the two devices. The interposer layer may also comprise passive components required for the operating of the sensing module.

Additionally, the fingerprint sensing module may comprise a mechanical support layer arranged between the fingerprint sensor control device and the second side of said fingerprint sensing module. The mechanical support layer can for example be a compliant polymer based material. A mechanical support layer may increase the flexibility of the sensing module, allowing the module to flex more without breaking. This may be particularly advantageous for a sensing module integrated in a smart card, due to the flexibility of the smart card.

According to one embodiment of the invention, the fingerprint sensing module may further comprise an electrically conductive bezel arranged adjacent to the sensing array to provide an electrical connection between a finger placed on the sensing surface and drive signal circuitry of the fingerprint sensing module. The bezel may for example be a frame arranged to surround the sensor device such that a finger placed on the sensing surface also makes contact with the bezel. Thereby, a drive signal can be provided to the finger, which facilitates capacitive fingerprint measurement according to established sensing technology. In case of the cover structure being a laminate structure comprising a plurality of conductive layers, the top metal layer in the laminate structure may advantageously be used to form an electrical contact to the bezel. It should however be noted that the sensing module equally well may operate without a bezel, in which case a drive signal may be provided to a sensing element of the sensing array, or to a reference ground level of the fingerprint sensing device.

According to one embodiment of the invention, the cover structure extends outside of the fingerprint sensor device such that the fingerprint sensing module has a T-shaped profile. In other words, the cover structure extends outside of the surface of the sensor device on at least two opposing sides of the sensing device. In case of a square or rectangular sensing module, the cover structure may extend outside of the sensor device on all four sides of the sensor device. Accordingly it is possible to provide connections on the underside of the cover structure on at least two sides sensor device, thereby increasing the various possible ways to connect the fingerprint sensor module to an electronic device, a smart card and the like. Moreover, a fingerprint sensing module having a T-shaped profile can easily be placed in a corresponding recess or opening, as will be described in further detail in the following.

According to one embodiment of the invention the cover structure may be flexible, such as a flex film or the like, thereby facilitating integration of the fingerprint sensing module in smart cards wherein it is particularly desirable to have flexible module due to the flexibility of the card itself. Through a flexible cover layer, the fingerprint module can flex and follow a bending of e.g. a smart card without the sensing device itself having to be flexible.

However, it should be noted that the cover structure equally well be rigid, such as a glass or ceramic structure, which may be more suitable for integrating the fingerprint sensing module in other types of devices. The cover structure may for example be a protective plate, a cover glass or a display glass comprising conductive traces.

According to one embodiment of the invention, the fingerprint sensing module may advantageously comprise a secure element, which is often required in a smart card to provide a secure memory and execution environment. The secure element may for example be included in a stack comprising the fingerprint sensor device and, optionally, the fingerprint sensor control device. However, the secure element can also be arranged in other locations, such as on a carrier or on the cover structure.

According to one embodiment of the invention, there is provided a smart card comprising a fingerprint sensing module according to any one of the above described embodiments. The smart card comprises a recess into which the fingerprint sensing module is arranged, wherein the cover structure of the fingerprint sensing module comprises connection pads for connecting the conductive traces to corresponding connection pads of a conductive inlay of said smart card. Thereby, a smart card is formed wherein the fingerprint sensor device and any associated circuitry can be easily connected to smart card circuitry by means of the connection pads of the cover layer. In particular, the sensing module can be connected to circuitry of the smart card handling authentication and/or verification of an identity of a user so as to provide increased security in connection with use of the smart card. The smart card may for example be used for authorizing a financial transaction, for verifying an identity and/or for granting access. A smart card can be considered to be any pocket-sized card that has embedded integrated circuits.

According to one embodiment of the invention the recess of the smart card may advantageously have a shape corresponding to a shape of the fingerprint sensing module. Thereby, the fingerprint sensing module can be fitted into the recess with a minimal or no gap between the outer layer of the smart card and the sensing module. The recess may for example be T-shaped and configured to receive a correspondingly T-shaped fingerprint sensing module.

According to a second aspect of the invention, there is provided a method for manufacturing a fingerprint sensing module comprising providing a fingerprint sensor device having a sensing array arranged on a first side of the device, the sensing array comprising an array of fingerprint sensing elements, wherein the fingerprint sensor device comprises connection pads for connecting the fingerprint sensor device to external circuitry, providing a fingerprint sensor device cover structure comprising conductive traces for electrically connecting the fingerprint sensor module to the external circuitry; attaching the fingerprint sensor device to the cover structure; and electrically connecting the fingerprint sensor device by means of wire bonding between the connections pads and said conductive traces.

Hereby, a method for manufacturing a fingerprint sensing module is provided which can be performed using conventional processing steps well known in the field of microelectronic manufacturing. Accordingly, the described module can be manufactured using existing processes.

It should be noted that the cover structure may also comprise connection pads for facilitating wire bonding.

According to one embodiment of the invention, the method may further comprise attaching a fingerprint sensor control device to a second side of the fingerprint sensing module, the second side being opposite of the first side. Thereby, the fingerprint control circuit can be formed in a stacked arrangement with the sensing device, providing a convenient module where the control circuit functionality is integrated in the same module as the sensing device.

According to one embodiment of the invention, the method may further comprise encapsulating the fingerprint sensing module. Encapsulating means that the backside of the module, i.e. the side opposite the side of the cover structure acting as sensing surface, is encapsulated using a cap or mold material in order to protect the devices of the module and to provide a module which is easy to handle. At least a portion of the conductive traces of the cover structure, and in particular the connection pads used to connect to the sensor device via the conductive traces, is not covered by the encapsulation in order to enable connection of the fingerprint sensing module to external circuitry. Wire-bond and encapsulation processes on 35-mm wide reel-to reel format are today common in secure element module production for smart cards.

Additional effects and features of the second aspect of the invention are largely analogous to those described above in connection with the first aspect of the invention.

According to a third aspect of the invention, there is provided a method for manufacturing a smart card comprising a fingerprint sensing module according to any one of the above described embodiments, the method comprising: providing a smart card substrate comprising a plurality of layers; forming a recess in the smart card, the recess comprising a lower portion and an upper portion, the upper portion having an area larger than an area of the lower portion; forming via connections between the upper portion of the recess and conductive traces of the smart card; and arranging a sensing module in the recess such that the conductive traces of the cover layer form an electrical contact with the via connections.

The smart card substrate may be a conventional laminate smart card substrate comprising one or more electrically conductive layers sandwiched between a plurality of insulating layers. The upper and lower portions of the recess together form a recess advantageously have a profile corresponding to a T-shape, for receiving a T-shaped fingerprint module. Moreover, the module may be attached to the smart card using a flexible conductive adhesive to at the same time form an electrical connection between the conductive traces of the cover structure and a conductive inlay of the smart card, in order to electrically connect the fingerprint sensing module to smart card circuitry.

Most payment cards today are laminated with a conductive inlay at the center of the card. A process referred to as milling and drilling is typically used to create the cavity for secure element integration in the smart card. According to various embodiments of the described invention, such a "mill and drill" technique can be used to for a recess for receiving the fingerprint sensing module. Thereby, existing manufacturing methods for smart cards can be used to also integrate a fingerprint sensor, thereby lowering the threshold for fingerprint sensor integration in smart cards.

Additional effects and features of the third aspect of the invention are largely analogous to those described above in connection with the first and second aspects of the invention.

Further features of, and advantages with, the present invention will become apparent when studying the appended claims and the following description. The skilled person realize that different features of the present invention may be combined to create embodiments other than those described in the following, without departing from the scope of the present invention.

BRIEF DESCRIPTION OF THE DRAWINGS

These and other aspects of the present invention will now be described in more detail, with reference to the appended drawings showing an example embodiment of the invention, wherein.

DETAILED DESCRIPTION OF EXAMPLE EMBODIMENTS

In the present detailed description, various embodiments of the module and method according to the present invention are mainly described with reference to a fingerprint sensing module comprising a capacitive fingerprint sensor. Moreover, the fingerprint sensing module is described with reference to integration in a smart card. However, the described module may also be well suited for use in other applications, such as consumer electronic devices, internet-of-things (IoT) and automotive applications.

Figure 1:
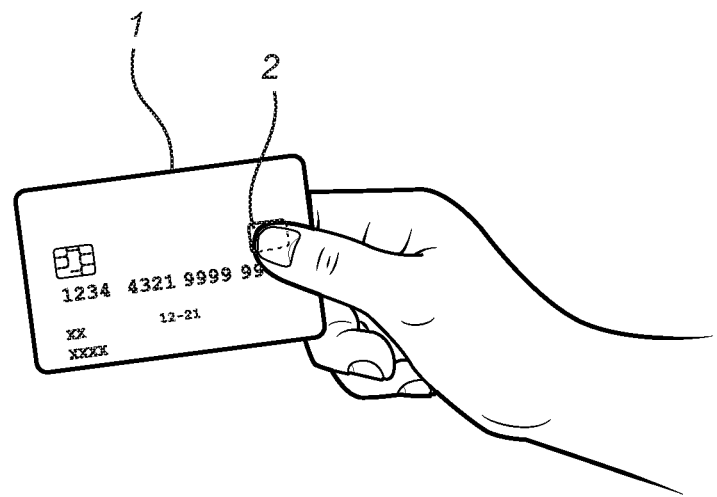
FIG. 1 schematically illustrates a smart card according to an embodiment of the invention.

FIG. 1 schematically illustrates a smart card 1 comprising fingerprint sensing module 2 according to an embodiment of the invention.

Figure 2:
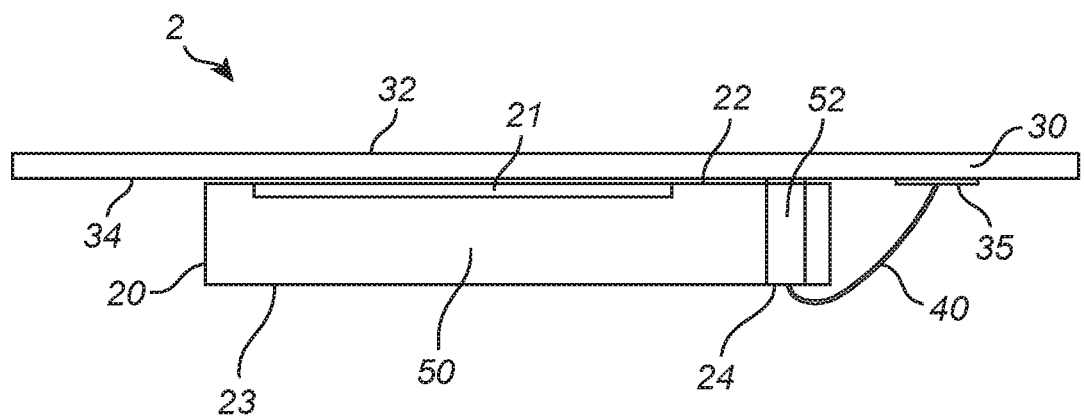
FIG. 2 schematically illustrates a fingerprint sensing module according to an embodiment of the invention.

FIG. 2 schematically illustrates a fingerprint sensing module 2 comprising a fingerprint sensor device 20 having a sensing array 21 arranged on a first side 22 of the device 20. The sensing array 21 comprises an array of fingerprint sensing elements, here electrically conducting plates, configured to detect a capacitive coupling between each sensing element and a finger placed on a sensing surface of the sensing module 2. The fingerprint sensor device 20 further comprises connection pads 24 for connecting the fingerprint sensor device 20 to external circuitry (not shown). The externa circuitry may for example be an integrated circuit in a smart card.

The fingerprint sensing module 2 further comprises a fingerprint sensor device cover structure 30 arranged to cover the fingerprint sensor device 21. The cover structure has a first side 32 configured to be touched by a finger, thereby forming a sensing surface 32 of the sensing module 2, and a second side 34 facing the sensing array 21. Moreover, the cover structure comprises conductive traces 35 for electrically connecting the fingerprint sensor module 2 to the external circuitry. As can be seen in FIG. 2, a surface area of the cover structure 30 is larger than a surface area of the sensor device 20, such that the conductive traces 35 of the sensing module can be connected to corresponding connection pads at a surface facing the same direction as the sensing surface 32. Finally, the fingerprint sensing module 2 further comprises wire-bonds 40 electrically connecting the connection pads 24 of the fingerprint sensing device 20 to the conductive traces 35 of the cover structure 20. Here, the connection pads 24 are arranged on the second side 23 of the sensor device 20 electrically connected to the sensing array 21 and associated sensing and readout circuitry by means of via connections 52 through the sensor substrate 50.

In the illustrated embodiment, a conventional fingerprint sensing device can be used, wherein an existing backside connection can be used to wire bond to the conductive traces 35 of the cover structure. Moreover, in the sensing module 2 illustrated in FIG. 2, the sensing array 21 is very close to the exterior surface 32 of the sensing module, i.e. the sensing surface, which in turn leads to a good capacitive coupling between a finger placed on the sensing surface and the sensing elements of the sensing array 21. In a smart card, the cover structure can be made thin, whereas for under-glass applications, for example when a fingerprint sensor is arranged under a display glass, the glass thickness is preferably at least 300 µm. In comparison, according to current ISO-standards, the total thickness of the smart card should be 760 µm.

Figure 3:
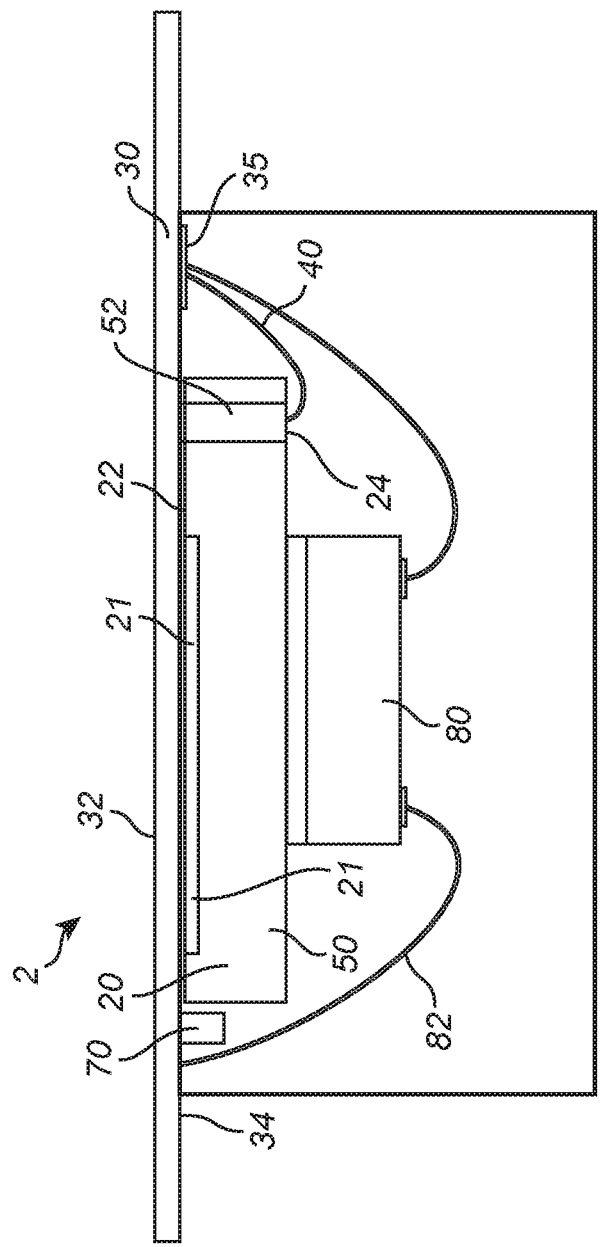
FIG. 3 schematically illustrates a fingerprint sensing module according to an embodiment of the invention.

FIG. 3 schematically illustrates a fingerprint sensing module 2 according to an embodiment of the invention. In addition to the components described above with reference to FIG. 2, the fingerprint sensing module 2 of FIG. 3 further comprises a passive component 70, arranged on the second side 34 of the cover structure 30 and electrically connected to conductive traces of the cover structure 30. One or more passive components 70 may be arranged directly on the cover structure as individual components, as capsules or as integrated passive devices (IPD:s).

Moreover, FIG. 3 also illustrates a fingerprint sensor control device 80 attached to a second side 23 of the fingerprint sensing device 20, the second side 20 being opposite of the first side 22. The fingerprint sensor control device 80 is connected to conductive traces 35 of the cover structure 30 by means of bond wires 82. An additional option, not illustrated herein, is to arrange passive components on the backside of the control device, and to connect also the passive components to external circuitry by wire bonding down to the conductive traces of the cover structure.

Figure 4:
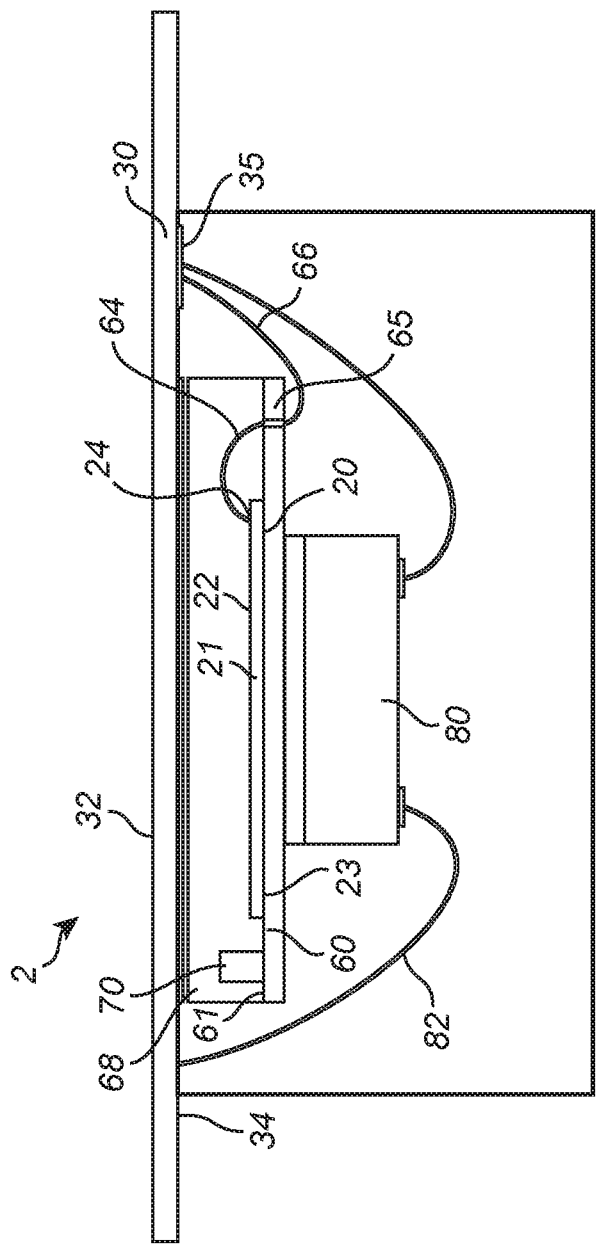
FIG. 4 schematically illustrates a fingerprint sensing module according to an embodiment of the invention.

FIG. 4 schematically illustrates a fingerprint sensing module 2 according to an embodiment of the invention where the connection pads 24 of the fingerprint sensor device 20 are arranged on the first side 22 of the fingerprint sensor device 20. In the illustrated embodiment, the fingerprint sensor device 20 is arranged on a carrier 60 having a first side 61 attached to the second side 23 of the fingerprint sensor device 20. The carrier 60 may for example be a flexible substrate or a PCB. The fingerprint sensor device 20 is connected via wire bonds 64 from the connection pads 24 of the fingerprint sensor device 20 to the first side of the carrier 60. The electrical connection 65 is then formed through the carrier 60 and further on to conductive traces 35 of the cover structure 30 by means of wire-bonds 66 connected between the second side of the carrier 60, opposite of the first side 61, and the conductive traces 35.

Figure 5:
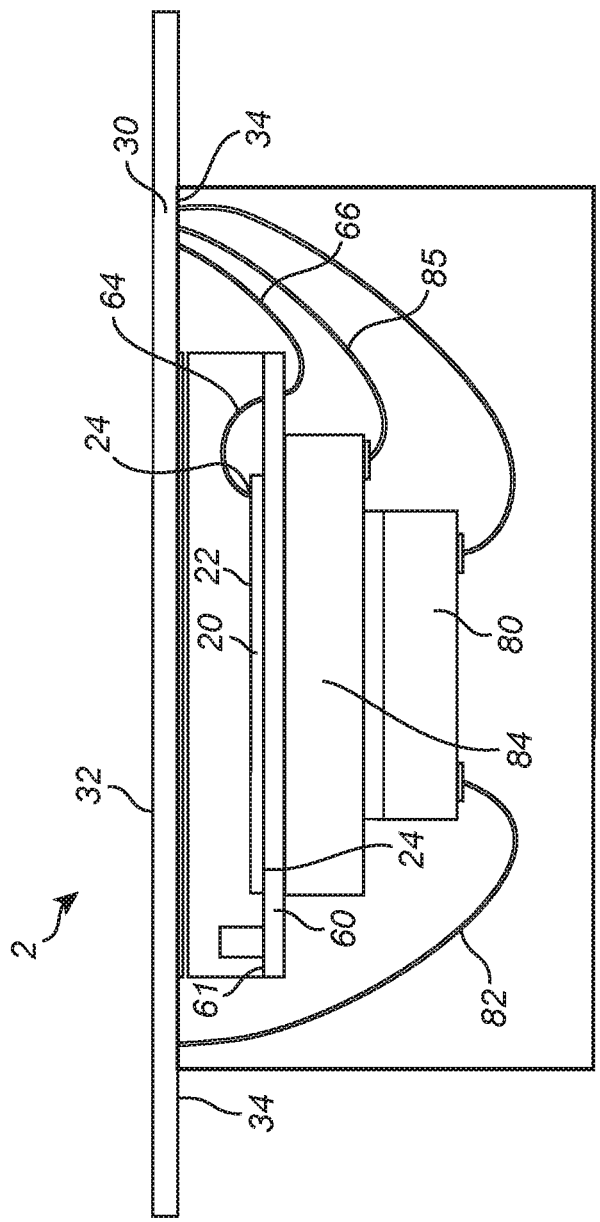
FIG. 5 schematically illustrates a fingerprint sensing module according to an embodiment of the invention.

The fingerprint sensing module of FIG. 5 is largely similar to the module illustrated in FIG. 4. A difference is that an additional layer 84 is located between the carrier 60 and the fingerprint control device 80. In one embodiment, the layer 84 is a silicon interposer layer 84 which may be used to route signals between the two devices, 20, 80 and it may also comprise integrated passive components. The interposer layer is illustrated to comprise wire-bonds 85 connecting the interposer to the cover structure 30. In another embodiment, the layer 84 may be a mechanical support layer protecting the devices of the module, in which case there is no need for wire-bonding. The circuitry of the fingerprint sensor device 20 and the fingerprint sensor control device 80 is typically made in silicon, which in general is a rigid material, even though silicon can be flexible in sufficiently thin layers. However, by means of the mechanical support layer, the silicon devices may achieve additional flexibility without breaking.

Figure 6:
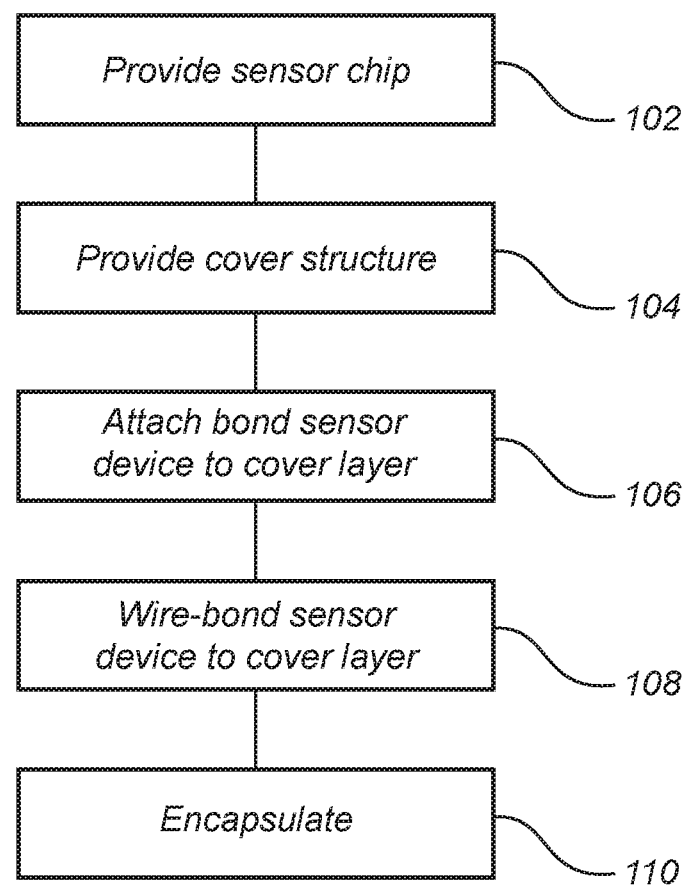
FIG. 6 is a flow chart outlining the general steps of a method of manufacturing a fingerprint sensing module according to an embodiment of the invention.

FIG. 6 is a flow chart outlining the general steps of a method for manufacturing a fingerprint sensing module according to an embodiment of the invention. The method will be described with reference to FIG. 2, illustrating an embodiment of the fingerprint sensing module 2. The method comprises providing 102 a fingerprint sensor device 20 and providing 104 a fingerprint sensor device cover structure 30 comprising conductive traces for electrically connecting the fingerprint sensor module 2 to external circuitry. Next, the fingerprint sensor device 20 is attached to the cover structure 30 and electrically connected said fingerprint sensor device 20 by means of wire bonding 108 between the connections pad 24 of the fingerprint sensor device 20 and the conductive traces 35 of the cover structure 30. In a final step, the side of the module 2 comprising the wire bonds is encapsulated 110 in order to protect the bond wires and the devices.

FIGS. 7A-G schematically illustrate a method of manufacturing a smart card comprising a fingerprint sensing module according to any of the embodiments described herein.

Figure 7A:
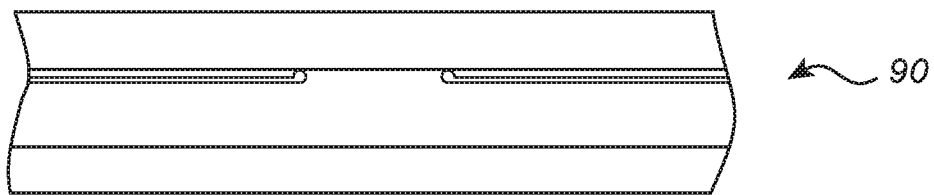
FIGS. 7A-G schematically illustrate a method of manufacturing a smart card according to an embodiment of the invention.
Figure 7B:
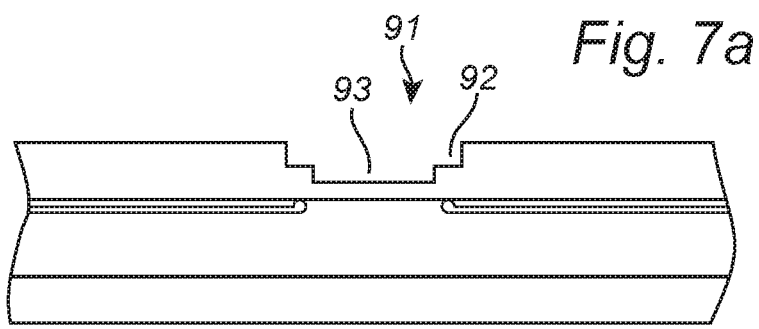

FIG. 7A illustrates a laminate smart card substrate 90 comprising a plurality of layers. Forming the smart card comprises milling and drilling the top layer of the smart card substrate 90 to form a recess 91. The recess 90 comprises an upper portion 92 and a lower portion 93, where the upper portion 92 has an area larger than an area of the lower portion 93, thereby a T-shaped recess is formed.

Figure 7C:
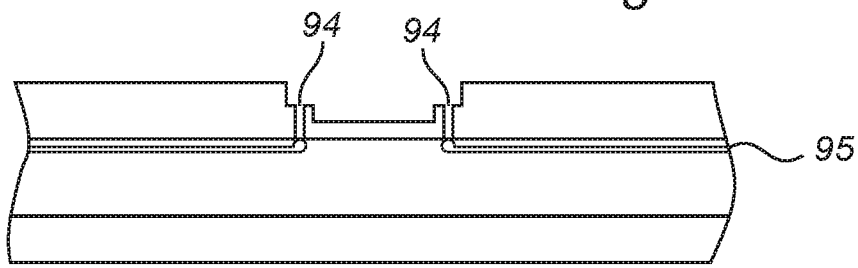

FIG. 7c illustrates openings 94 drilled from the upper portion of the recess 92 down to a conductive layer 95 of the smart card substrate. The smart card may in practice comprise a plurality of layers. However, for simplicity, only one conductive layer is illustrated. The conductive layer(s) of the smart card comprise conductive traces for connecting the fingerprint sensing module 2 to an integrated circuit of the smart card.

Figure 7D:
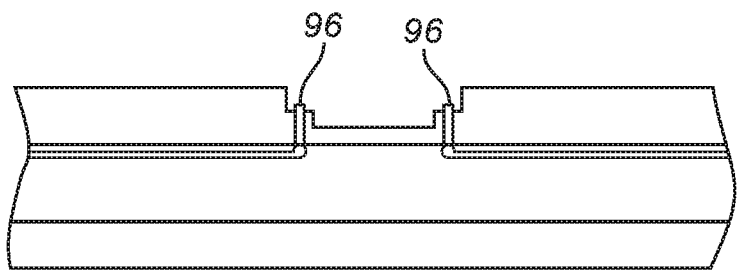

In FIG. 7D, a conductive material is arranged in the openings 94 to form conductive via connections 96 to the conductive layer 95.

Figure 7E:
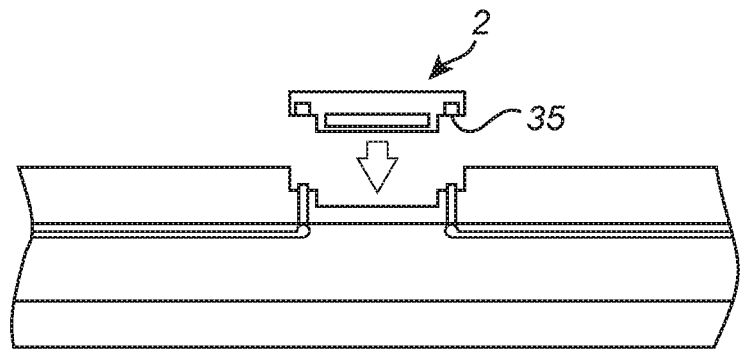
Figure 7F:
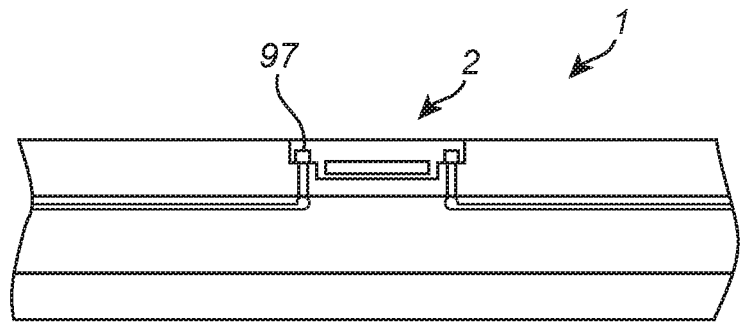
Figure 7G:
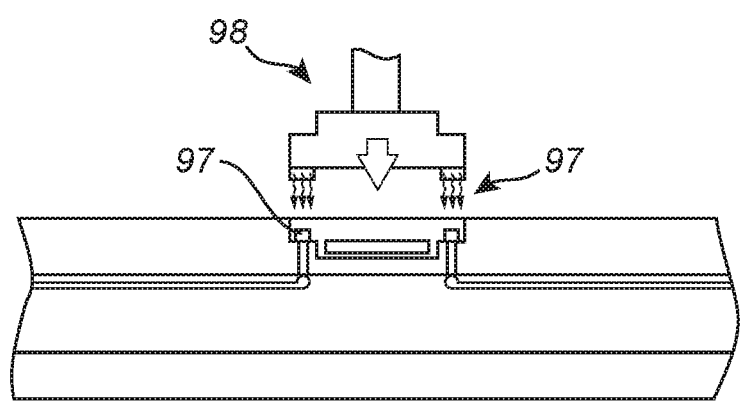

FIG. 7E illustrates providing a sensing module 2 having T-shape corresponding to the T-shape of the recess 91, and in FIG. 7F, the sensing module is arranged in the recess. In particular, the conductive traces 35 of the cover structure 30 are located such that they form an electrical connection with the via connections 96 of the smart card. The fingerprint sensing module 2 is advantageously attached to the smart card substrate 90 using a conductive adhesive 97 at the locations of the via connections 96.

In a final step, illustrated in FIG. 7D, the adhesive 97 is heated using a heating tool 98 to cure the adhesive. Instead of using a conductive adhesive, it is also possible to use a low temperature solder material, where the soldering temperature is sufficiently low to prevent melting the smart card substrate.

Figure 8:
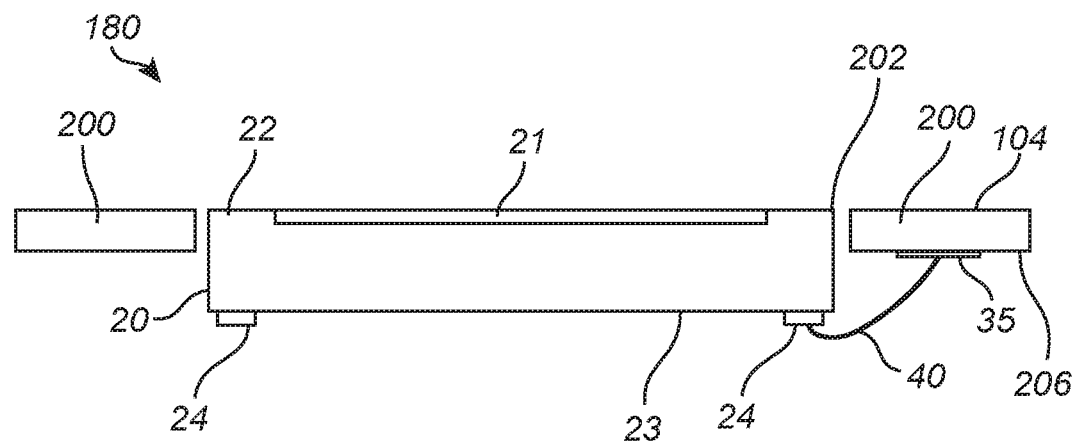
FIG. 8 schematically illustrates a fingerprint sensing module according to an embodiment of the invention.

FIG. 8 schematically illustrates a fingerprint sensing module 180 comprising: a fingerprint sensor device 20 having a sensing array 21 arranged on a first side 22 of the device 20, the sensing array 21 comprising an array of fingerprint sensing elements. The fingerprint sensor device 20 further comprises connection pads 24 arranged on a second side 23 of the fingerprint sensor device 20 for connecting the fingerprint sensor device 20 to external circuitry. The fingerprint sensing module 180 further comprises a smart card substrate 200 comprising an opening 202 in which the fingerprint sensor device 20 is arranged, the smart card substrate 200 having a first side 204 facing in the same direction as the sensing array 21 and a second side 206 opposite the first side 204, wherein the smart card substrate 200 comprises conductive traces 35 arranged on the second side 206 of the smart card substrate 200, for electrically connecting the fingerprint sensing module 180 to external circuitry; wherein the fingerprint sensor device 20 further comprises wire-bonds 40 electrically connecting the connection pads 24 of the fingerprint sensing device 20 to the conductive traces 35 of the smart card substrate 200.

Figure 9:
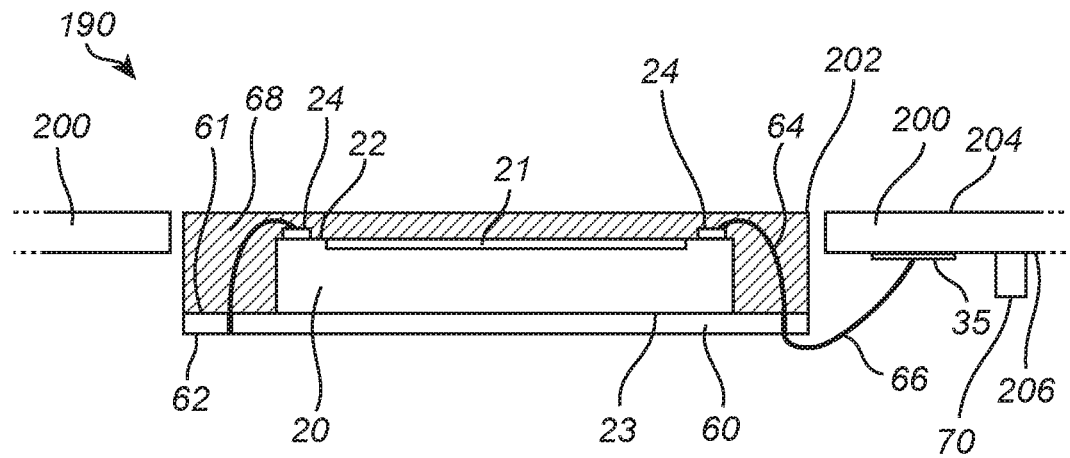
FIG. 9 schematically illustrates a fingerprint sensing module according to an embodiment of the invention.

FIG. 9 schematically illustrates a fingerprint sensing module 190 comprising: a fingerprint sensor device 20 having a sensing array 21 arranged on a first side 22 of the device, the sensing array 21 comprising an array of fingerprint sensing elements, wherein the fingerprint sensor device 20 comprises connection pads 24 arranged on the first side 22 of the fingerprint sensing device 20 for connecting the fingerprint sensor device 20 to external circuitry. The fingerprint sensing module 190 further comprises a smart card substrate 200 comprising an opening 202 in which the fingerprint sensor device 20 is arranged, the smart card substrate 200 having a first side 204 facing in the same direction as the sensing array 21 and a second side 206 opposite the first side, wherein the smart card substrate 200 comprises conductive traces 35 arranged on the second side 206 of the smart card substrate 200, for electrically connecting the fingerprint sensing module 190 to external circuitry; and a carrier 60 having a first side 61 attached to a second side 23 of the fingerprint sensor device 20, opposite of the first side 22 of the fingerprint sensor device 20.

The fingerprint sensor device 20 further comprises wire-bonds 64, 66 electrically connecting the connection pads 24 of the fingerprint sensor device 20 to the conductive traces 35 of the smart card substrate 200. The wire-bonds comprises: wire-bonds 64 between the connection pads 24 of the fingerprint sensor device 20 and the first side 61 of the carrier 60, and wire-bonds 66 arranged between a second side 62 of the carrier 60, opposite of the first side 61 of the carrier 60, and the conductive traces 35 of the smart card substrate 200.

The fingerprint sensing module 190 also includes a mold layer 68 covering the sensing array 21 and embedding the wire bonds 64 between the sensor device 20 and the carrier 60.

FIG. 9 further illustrates a passive component 70 arranged on the second side 206 of the smart card substrate 200. It would also be possible to arrange a passive component 70 on the second side of the carrier 60.

Figure 10:
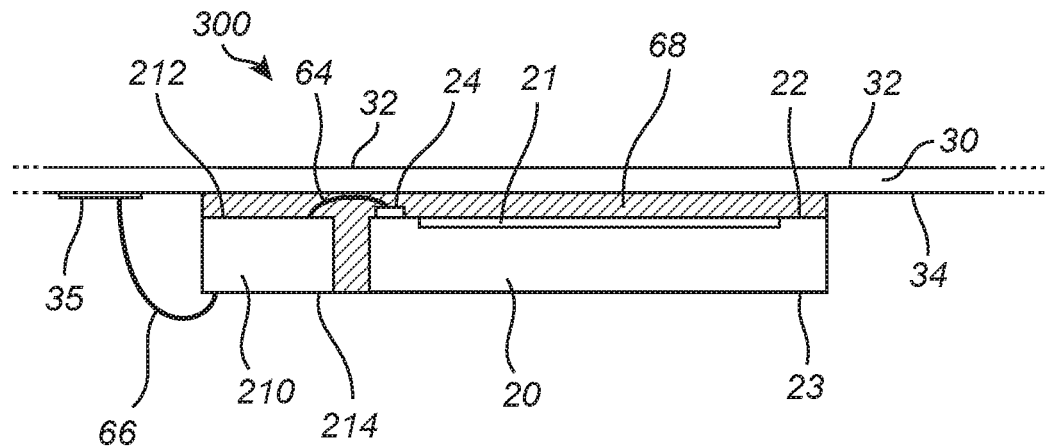
FIG. 10 schematically illustrates a fingerprint sensing module according to an embodiment of the invention.

FIG. 10 schematically illustrates a fingerprint sensing module 300 comprising: a fingerprint sensor device 20 having a sensing array 21 arranged on a first side 22 of the device 20, the sensing array 21 comprising an array of fingerprint sensing elements, wherein the fingerprint sensor device 20 comprises connection pads 24 arranged on the first side 22 of the fingerprint sensing device 20 for connecting the fingerprint sensor device 20 to external circuitry. The fingerprint sensing module 300 further comprises a fingerprint sensor device cover structure 30 arranged to cover the fingerprint sensor device 20, the cover structure 30 having a first side 32 configured to be touched by a finger, thereby forming a sensing surface of the sensing module 300, and a second side 34 facing the sensing array 21, wherein the cover structure 30 comprises conductive traces 35 arranged on the second side 34 of the cover structure, for electrically connecting the fingerprint sensing module 300 to external circuitry, and wherein a surface area of the cover structure 30 is larger than a surface area of the sensor device 20; and a carrier 210 having a first side 212 facing in the same direction as the sensing array 21, the carrier 214 being arranged adjacent to the fingerprint sensor device 20.

The fingerprint sensor device 20 further comprises wire-bonds 64, 66 electrically connecting the connection pads 24 of the fingerprint sensor device 20 to the conductive traces 35 of the cover structure 30, the wire-bonds comprising first wire-bonds 64 between the connection pads 24 of the fingerprint sensor device and the first side 212 of the carrier 210, and second wire-bonds 66 arranged between a second side 214 of the carrier 210, opposite of the first side of the carrier, and the conductive traces 35 of the cover structure 30. The connection through the carrier 210 for electrically connecting the first wire bonds 64 to the second wire bonds 66 may for example be provided in the form of via connections (not shown) through the carrier 210.

Figure 11:
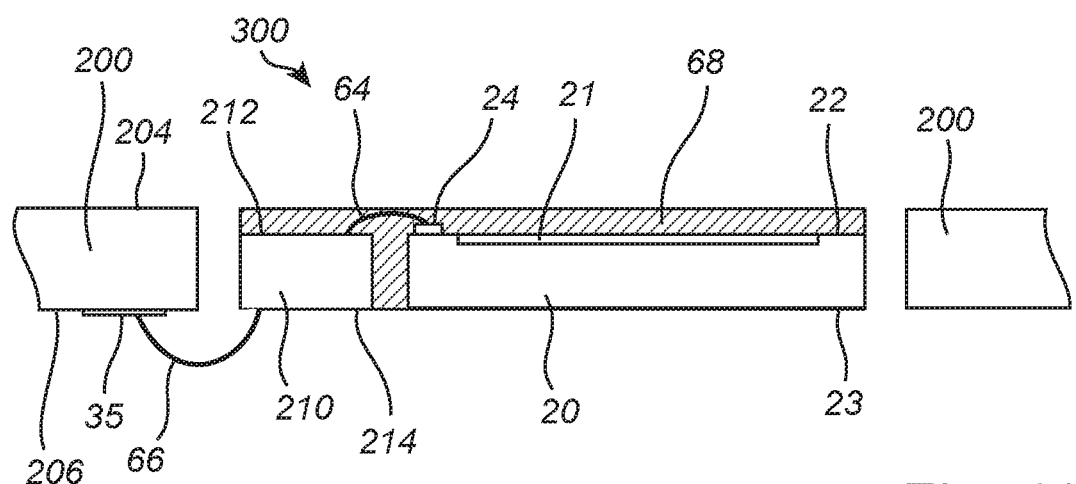
FIG. 11 schematically illustrates a fingerprint sensing module according to an embodiment of the invention.

FIG. 11 schematically illustrates a fingerprint sensing module 210 comprising: a fingerprint sensor device 20 having a sensing array 21 arranged on a first side 22 of the device 20, the sensing array 21 comprising an array of fingerprint sensing elements, wherein the fingerprint sensor device 20 comprises connection pads 24 arranged on the first side 22 of the fingerprint sensing device 20 for connecting the fingerprint sensor device 20 to external circuitry.

The fingerprint sensing module 210 further comprises a smart card substrate 200 comprising an opening 202 in which the fingerprint sensor device 20 is arranged, the smart card substrate 200 having a first side 204 facing in the same direction as the sensing array 21 and a second side 206 opposite the first side 204, wherein the smart card substrate 200 comprises conductive traces 35 arranged on the second side 206 of the smart card substrate 200, for electrically connecting the fingerprint sensing module 310 to external circuitry; and a carrier 210 having a first side 212 facing in the same direction as the sensing array 21, the carrier 210 being arranged adjacent to the fingerprint sensor device 20.

The fingerprint sensor device 20 further comprises wire-bonds 64, 66 electrically connecting the connection pads 24 of the fingerprint sensor device 20 to the conductive traces 35 of the smart card substrate 200, the wire-bonds comprising: wire-bonds 64 between the connection pads 24 of the fingerprint sensor device and the first side 212 of the carrier 210, and wire-bonds 66 arranged between a second side 214 of the carrier 210, opposite of the first side 212 of the carrier 210, and the conductive traces 35 of the smart card substrate.

Figure 12:
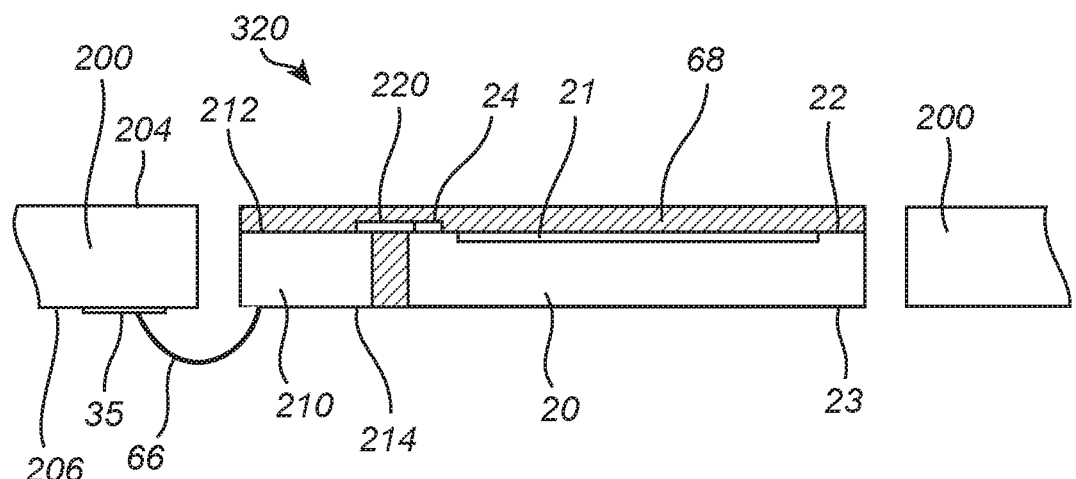
FIG. 12 schematically illustrates a fingerprint sensing module according to an embodiment of the invention.

FIG. 12 schematically illustrates a fingerprint sensing module 320 comprising: a fingerprint sensor device 20 having a sensing array 21 arranged on a first side 22 of the device 20, the sensing array 21 comprising an array of fingerprint sensing elements, wherein the fingerprint sensor device 20 comprises connection pads 24 arranged on the first side 22 of the fingerprint sensing device 20 for connecting the fingerprint sensor device 20 to external circuitry.

The fingerprint sensing module 320 further comprises a smart card substrate 200 comprising an opening 202 in which the fingerprint sensor device 20 is arranged, the smart card substrate 200 having a first side 204 facing in the same direction as the sensing array 21 and a second side 206 opposite the first side 204, wherein the smart card substrate 200 comprises conductive traces 35 arranged on the second side 206 of the smart card substrate 200, for electrically connecting the fingerprint sensing module 310 to external circuitry; and a carrier 210 having a first side 212 facing in the same direction as the sensing array 21, the carrier 210 being arranged adjacent to the fingerprint sensor device 20; conductive traces 220 connecting the connection pads 24 of the fingerprint sensor device 20 to the first side 212 of the carrier 210, and wire-bonds 66 arranged between a second side 114 of the carrier, opposite of the first side 112 of the carrier, and the conductive traces 35 of the smart card substrate 200.

The various embodiments of a fingerprint sensing module illustrated herein comprises one control device, one passive component etc. However, the skilled person readily realizes that the described module may equally well comprise two or more of the various described devices and components.

Moreover, even though the invention has been described with reference to specific exemplifying embodiments thereof, many different alterations, modifications and the like will become apparent for those skilled in the art. Also, it should be noted that parts of the module, smart card and method may be omitted, interchanged or arranged in various ways, the module, smart card and method yet being able to perform the functionality of the present invention.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

What is claimed is:
1. A fingerprint sensing module comprising:
  a fingerprint sensor device having a sensing array arranged on a first side of the device, the sensing array comprising an array of fingerprint sensing elements, wherein said fingerprint sensor device comprises connection pads arranged on said first side of said finger- print sensing device for connecting said fingerprint sensor device to external circuitry;
a smart card substrate comprising an opening in which the fingerprint sensor device is arranged, said smart card substrate having a first side facing in the same direction as the sensing array and a second side opposite the first side, wherein said smart card substrate comprises conductive traces arranged on the second side of the smart card substrate, for electrically connecting said fingerprint sensing module to external circuitry; and
a carrier having a first side attached to a second side of said fingerprint sensor device, opposite of said first side of said fingerprint sensor device;
wherein said fingerprint sensor device further comprises wire-bonds electrically connecting said connection pads of said fingerprint sensor device to said conductive traces of said smart card substrate, said wire-bonds comprising:
wire-bonds between said connection pads of said fingerprint sensor device and said first side of said carrier, and
wire-bonds arranged between a second side of said carrier, opposite of said first side of said carrier, and said conductive traces of said smart card substrate.

2. The fingerprint sensing module according to claim 1, further comprising a passive component arranged on said second side of said smart card substrate and electrically connected to the conductive traces of said smart card substrate.

3. A smart card comprising a fingerprint sensing module according to claim 1.

4. A fingerprint sensing module comprising:
a fingerprint sensor device having a sensing array arranged on a first side of the device, the sensing array comprising an array of fingerprint sensing elements, wherein said fingerprint sensor device comprises connection pads arranged on said first side of said fingerprint sensing device for connecting said fingerprint sensor device to external circuitry;
a fingerprint sensor device cover structure arranged to cover said fingerprint sensor device, said cover structure having a first side configured to be touched by a finger, thereby forming a sensing surface of said sensing module, and a second side facing said sensing array, wherein said cover structure comprises conductive traces arranged on the second side of the cover structure, for electrically connecting said fingerprint sensing module to external circuitry, and wherein a surface area of said cover structure is larger than a surface area of said sensor device; and
a carrier having a first side facing in the same direction as the sensing array, the carrier being arranged adjacent to said fingerprint sensor device;
wherein said fingerprint sensor device further comprises wire-bonds electrically connecting said connection pads of said fingerprint sensor device to said conductive traces of said cover structure, said wire-bonds comprising:
wire-bonds between said connection pads of said fingerprint sensor device and said first side of said carrier, and
wire-bonds arranged between a second side of said carrier, opposite of said first side of said carrier, and said conductive traces of said cover structure.

5. A smart card comprising a fingerprint sensing module according to claim 4.

6. A fingerprint sensing module comprising:
a fingerprint sensor device having a sensing array arranged on a first side of the device, the sensing array comprising an array of fingerprint sensing elements, wherein said fingerprint sensor device comprises connection pads arranged on said first side of said fingerprint sensing device for connecting said fingerprint sensor device to external circuitry;
a smart card substrate comprising an opening in which the fingerprint sensor device is arranged, said smart card substrate having a first side facing in the same direction as the sensing array and a second side opposite the first side, wherein said smart card substrate comprises conductive traces arranged on the second side of the smart card substrate, for electrically connecting said fingerprint sensing module to external circuitry; and
a carrier having a first side facing in the same direction as the sensing array, the carrier being arranged adjacent to said fingerprint sensor device;
wherein said fingerprint sensor device further comprises wire-bonds electrically connecting said connection pads of said fingerprint sensor device to said conductive traces of said smart card substrate, said wire-bonds comprising:
wire-bonds between said connection pads of said fingerprint sensor device and said first side of said carrier, and
wire-bonds arranged between a second side of said carrier, opposite of said first side of said carrier, and said conductive traces of said smart card substrate.

7. A fingerprint sensing module comprising:
a fingerprint sensor device having a sensing array arranged on a first side of the device, the sensing array comprising an array of fingerprint sensing elements, wherein said fingerprint sensor device comprises connection pads arranged on said first side of said fingerprint sensing device for connecting said fingerprint sensor device to external circuitry;
a smart card substrate comprising an opening in which the fingerprint sensor device is arranged, said smart card substrate having a first side facing in the same direction as the sensing array and a second side opposite the first side, wherein said smart card substrate comprises conductive traces arranged on the second side of the smart card substrate, for electrically connecting said fingerprint sensing module to external circuitry; and
a carrier having a first side facing in the same direction as the sensing array, the carrier being arranged adjacent to said fingerprint sensor device;
conductive traces connecting said connection pads of said fingerprint sensor device to said first side of said carrier, and
wire-bonds arranged between a second side of said carrier, opposite of said first side of said carrier, and said conductive traces of said smart card substrate.

* * * * *